(12) United States Patent
Suguro

(10) Patent No.: US 9,159,769 B2
(45) Date of Patent: Oct. 13, 2015

(54) SEMICONDUCTOR DEVICE, SEMICONDUCTOR DEVICE MANUFACTURING METHOD, AND SEMICONDUCTOR DEVICE MANUFACTURING APPARATUS

(71) Applicant: KABUSHIKI KAISHA TOSHIBA, Tokyo (JP)

(72) Inventor: Kyoichi Suguro, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/018,906

(22) Filed: Sep. 5, 2013

(65) Prior Publication Data
US 2014/0284540 A1  Sep. 25, 2014

(30) Foreign Application Priority Data

Mar. 22, 2013 (JP) .................................. 2013-060723

(51) Int. Cl.
*H01L 47/00* (2006.01)
*H01L 27/24* (2006.01)
*H01L 45/00* (2006.01)

(52) U.S. Cl.
CPC ........ *H01L 27/2409* (2013.01); *H01L 27/2463* (2013.01); *H01L 45/085* (2013.01);
(Continued)

(58) Field of Classification Search
CPC ... H01L 45/146; H01L 45/08; H01L 45/1233; H01L 45/1625; H01L 45/145; H01L 45/1675; H01L 45/1616; H01L 45/1641; H01L 27/2463; H01L 45/1266; H01L 27/2409; H01L 27/2436; H01L 27/2481

USPC .......... 257/2–4, 776, 513, E47.001, E27.004; 438/104, 430, 382, 666
See application file for complete search history.

(56) References Cited

U.S. PATENT DOCUMENTS

2008/0160858 A1  7/2008 Paolucci et al.
2012/0012803 A1  1/2012 Oshino
(Continued)

FOREIGN PATENT DOCUMENTS

JP   2012-064808   3/2012
JP   2012-174754   9/2012
(Continued)

OTHER PUBLICATIONS

Toshiba Corp., "Nonvolatile Storage Device and Method for Manufacturing the Same", English-language Abstract of JP 2012023173, (Feb. 2, 2012).
(Continued)

*Primary Examiner* — Mark A Laurenzi
(74) *Attorney, Agent, or Firm* — Finnegan, Henderson, Farabow, Garrett & Dunner, LLP

(57) ABSTRACT

According to one embodiment, a semiconductor device comprises a first electrode; a second electrode containing a metal element; and a variable resistance element formed between the first electrode and the second electrode. The variable resistance element comprises an insulating first film disposed on a side of the first electrode and containing oxygen; and a second film disposed on the side of the second electrode and containing an element having a diffusion coefficient larger than the diffusion coefficient of the metal element in the first film and an electronegativity higher than the electronegativity of the metal element.

15 Claims, 14 Drawing Sheets

(52) U.S. Cl.
CPC .......... *H01L45/1266* (2013.01); *H01L 45/146* (2013.01); *H01L 45/1616* (2013.01); *H01L 45/1675* (2013.01)

(56) References Cited

U.S. PATENT DOCUMENTS

| | | |
|---|---|---|
| 2012/0068146 A1 | 3/2012 | Hattori et al. |
| 2012/0241709 A1 | 9/2012 | Tsuji |
| 2012/0243293 A1 | 9/2012 | Takashima et al. |
| 2013/0134374 A1* | 5/2013 | Kim et al. .......................... 257/2 |

FOREIGN PATENT DOCUMENTS

| | | |
|---|---|---|
| JP | 2012-198968 | 10/2012 |
| WO | WO 2011-071009 | 6/2011 |

OTHER PUBLICATIONS

Paolucci, et al., "Plasma Deposited Microporous Carbon Material", English-language Abstract of JP 2010514937, (May 6, 2010).

First Office Action issued by Japanese Patent Office in counterpart Application No. 2013-060723 mailed Jun. 9, 2015.

* cited by examiner

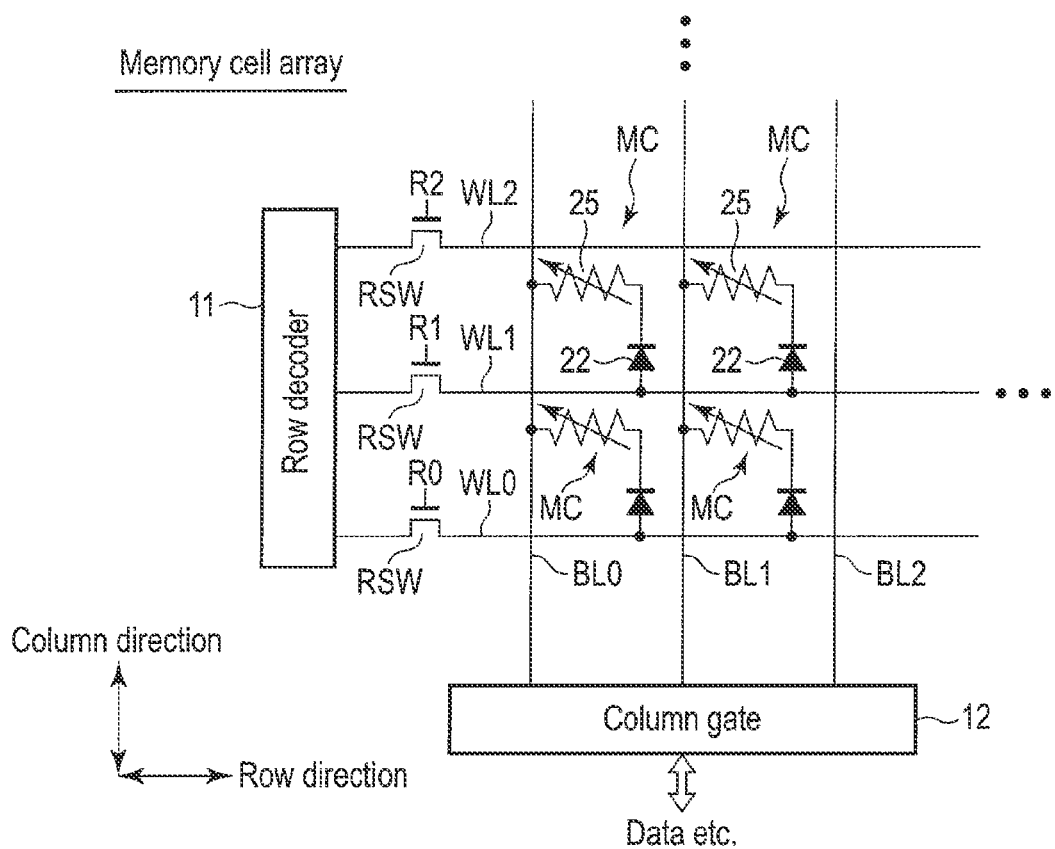
F I G. 2

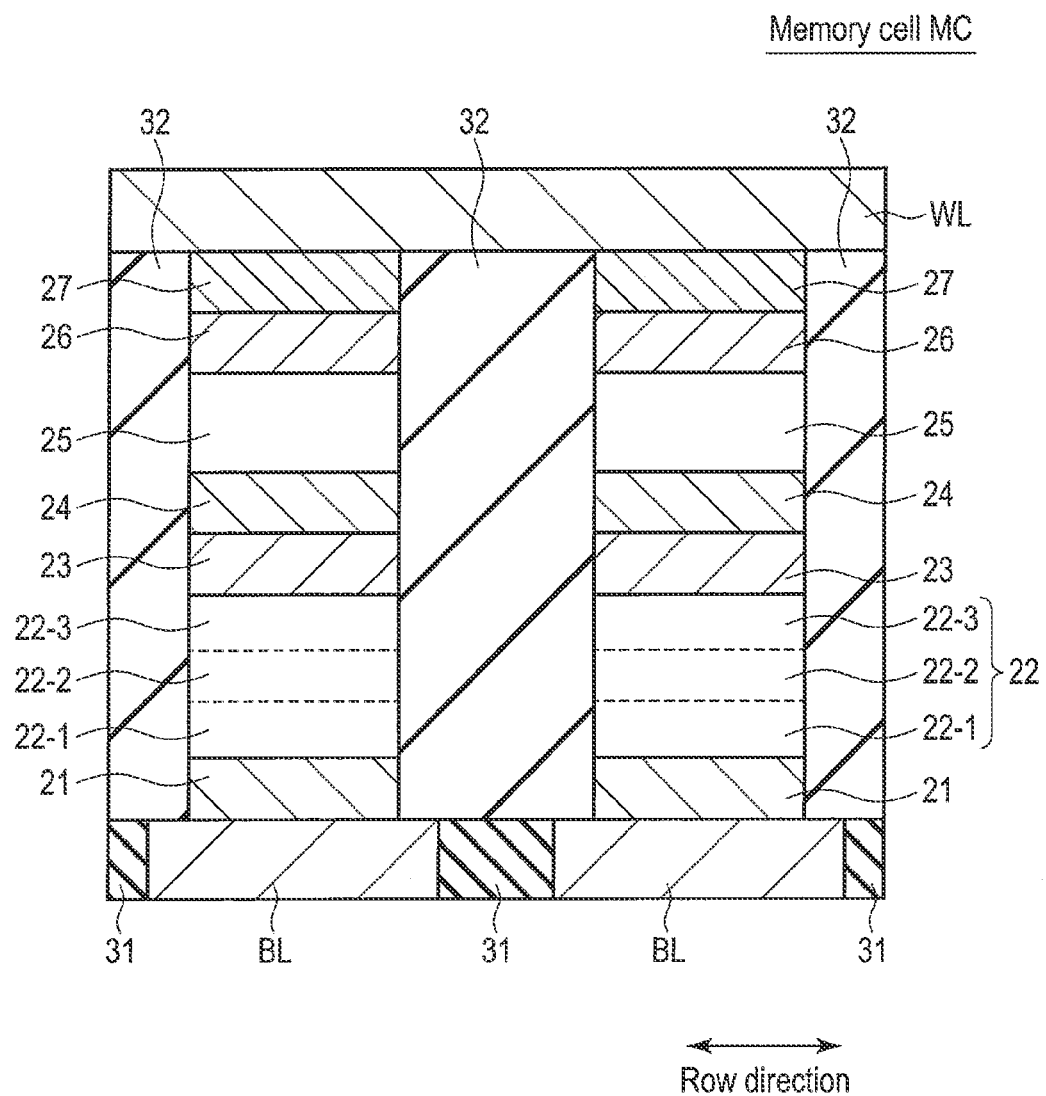
F I G. 3

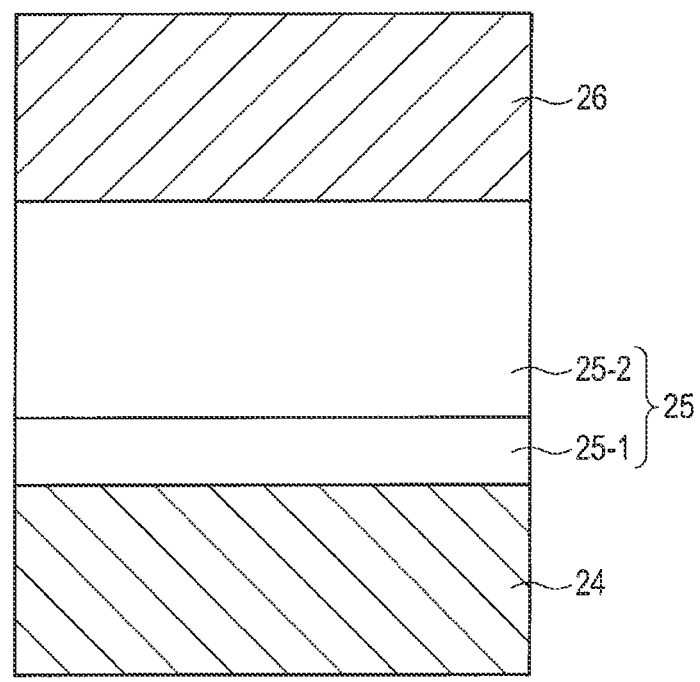
F I G. 4

SEMICONDUCTOR DEVICE, SEMICONDUCTOR DEVICE MANUFACTURING METHOD, AND SEMICONDUCTOR DEVICE MANUFACTURING APPARATUS

CROSS-REFERENCE TO RELATED APPLICATIONS

This application is based upon and claims the benefit of priority from the prior Japanese Patent Application No. 2013-060723, filed Mar. 22, 2013, the entire contents of which are incorporated herein by reference.

FIELD

Embodiments described herein relate generally to a semiconductor device, a semiconductor device manufacturing method, and a semiconductor device manufacturing apparatus.

BACKGROUND

When a voltage is applied to a metal oxide material, a phenomenon occurs in which the metal oxide material obtains two states, that is, a low resistance state and a high resistance state depending on the resistivity before voltage application and the magnitude of the applied voltage. An ReRAM (Resistance Random Access Memory) using this resistance change phenomenon as a storage medium (memory) has received a great deal of attention.

As for the device structure of the ReRAM, a three-dimensional cross-point structure including memory cells arranged at the intersections of word lines and bit lines has been proposed from the viewpoint of increasing the degree of integration. In the three-dimensional cross-point structure, at the time of write to a selected memory cell, a reverse bias is applied to unselected memory cells as well. For this reason, a storage element (variable resistance element) and a diode (rectifying element) having rectifying properties arranged as a memory cell. As the rectifying element, for example, an Si-PIN diode including a p-type impurity doped Si film (P), an Si film doped with no impurity or an Si film lightly doped with an impurity (I), and an n-type impurity doped Si film (N) is used.

One important thing of these functions is the variable resistance element that causes resistance change. As the variable resistance element, many metal oxide materials have been proposed. When changing the resistance state of a metal oxide film, a voltage is applied to move (diffuse) the metal element contained in the electrode material into the metal oxide film. A filament (conductive region) made of the metal element is thus formed in the metal oxide film, and the variable resistance element changes from the high resistance state to the low resistance state.

At this time, if the film thickness of the metal oxide film is 20 nm or more, the metal element diffuses into the entire metal oxide film. Even if the film thickness of the metal oxide film is 20 nm or less, the filament is difficult to form if the ionization of the metal element, is insufficient. Hence, when changing the variable resistance element to the low resistance state, a filament having a large size (for example, a width of 10 nm or more) is formed in the metal oxide film. Hence, the filament size largely varies depending on the place (for example, for each cell). Especially, when the memory cells are microfabricated to a width (diameter) of 10 nm or less and have a high density, some of them fail in forming the filament. As a result, the resistance value in the low resistance state may vary between the memory cells.

In addition, since the metal element diffuses into the entire metal oxide film in the low resistance state, it is difficult to move the metal element backward to obtain the high resistance state. For this reason, repetitive use may make even the resistance value in the high resistance state vary and may also decrease the resistance change amount between the low resistance state and the high resistance state.

Note that a structure using a single-layered GeSe film or a stacked film of an a-Si (amorphous silicon) film and an $SiO_X$ film in place of the metal oxide film has been proposed as the variable resistance element. However, these structures may also have the same phenomenon.

BRIEF DESCRIPTION OF THE DRAWINGS

FIG. 2 is a circuit diagram showing an example of the arrangement of the memory cell array according to the first embodiment;

FIG. 3 is a sectional view showing an example of the arrangement of memory cells according to the first embodiment;

FIG. 4 is a sectional view showing an example of the arrangement of a variable resistance element according to the first embodiment;

DETAILED DESCRIPTION

Figure 1:
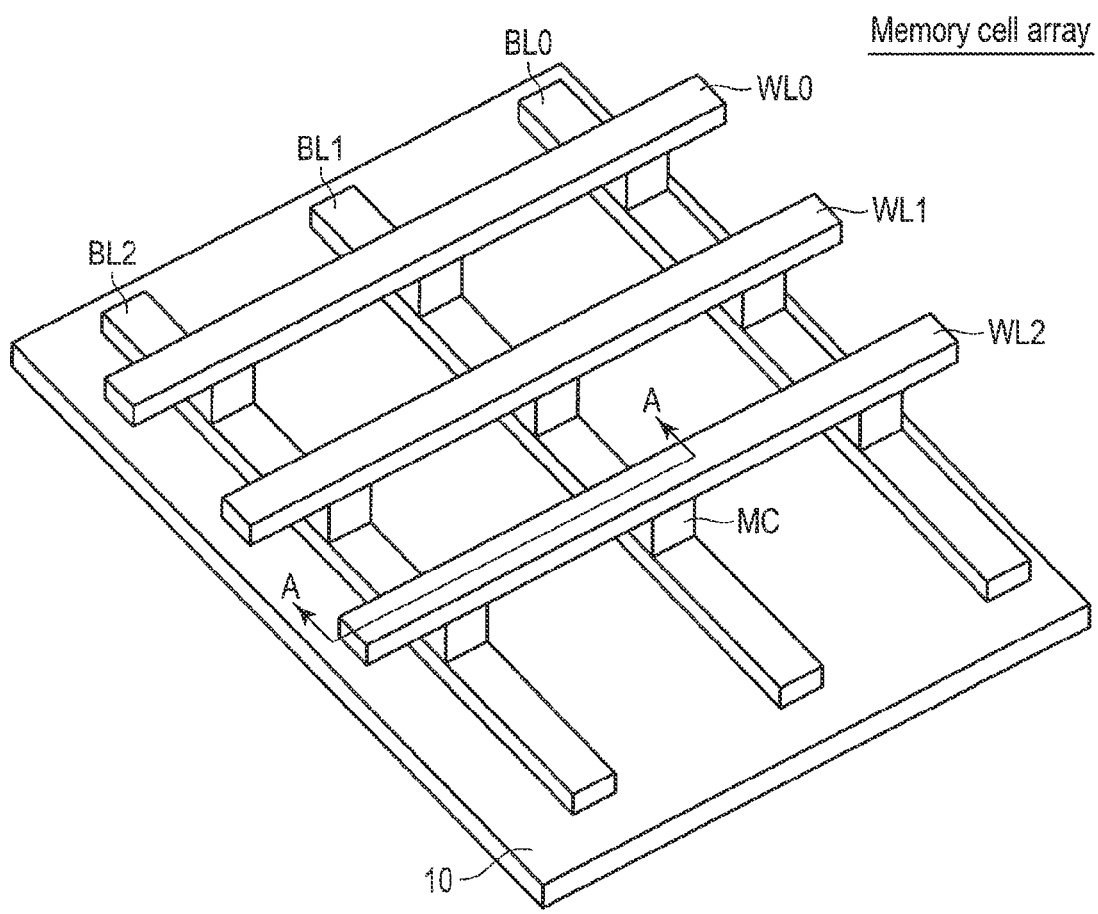
FIG. 1 is a perspective view showing an example of the arrangement of a memory cell, array according to the first embodiment.

In general, according to one embodiment, a semiconductor device includes a first electrode; a second electrode containing a metal element; and a variable resistance element formed between the first electrode and the second electrode. The variable resistance element comprises an insulating first film disposed on a side of the first electrode and containing oxygen; and a second film disposed on the side of the second electrode and containing an element having a diffusion coefficient larger than the diffusion coefficient of the metal element in the first film and an electronegativity higher than the electronegativity of the The embodiments will now be described with reference to the accompanying drawing. The same reference numerals denote the same parts throughout the drawings. A repetitive description will be made as needed.

First Embodiment

A semiconductor device (ReRAM) according to the first embodiment will be described with reference to FIGS. 1, 2, 3, 4, 5, 6, 7, 8, 9, 10, 11, and 12. In the first embodiment, a variable resistance element 25 is formed from a stacked film of a first film 25-1 including an insulating metal oxide film or an insulating semiconductor oxide film, and a second film 25-2 including a sulfide film or an Se compound film. This makes it possible to reduce the resistance variation between memory cells MC caused by microfabrication and also improve the reproducibility of a resistance change between a low resistance state and a high resistance state. The first embodiment will be described below in detail.

[Example of Arrangement and Operation of Memory Cell Array]

An example of the arrangement and operation of the memory cell array according to the first embodiment will be described below with reference to FIGS. 1 and 2.

FIG. 1 is a perspective view showing an example of the arrangement of the memory cell array according to the first embodiment.

As shown in FIG. 1, the memory cell array includes a plurality of bit lines BL0 to BL2 formed on an insulating film (not shown) on a semiconductor substrate 10, a plurality of word lines WL0 to WL2, and the plurality of memory cells MC. Note that in the following explanation, the bit lines BL0 to BL2 will simply be referred to as bit lines BL, and the word lines WL0 to WL2 as word lines WL if they need not particularly be distinguished.

The bit lines BL0 to BL2 extend in the column direction and are arranged in parallel to each other. The word lines WL0 to WL2 are formed above the bit lines BL0 to BL2, extend in the row direction, and are arranged in parallel to each other.

The bit lines BL and the word lines WL preferably contain a material that is resistant to heat and has a low resistance value. As the material of the bit lines BL and the word lines WL, for example, a metal material such as W, WSi, Mo, MoSi, NiSi, or CoSi or a carbon material such as a carbon nanotube or graphene is used.

The memory cells MC are arranged between the bit lines BL0 to BL2 and the word lines WL0 to WL2 at their intersections. That is, the memory cell array has a so-called cross-point memory arrangement.

Note that FIG. 1 illustrates an example in which one layer of bit lines BL and one layer of word lines WL are stacked. However, the number of layers is not limited to this. A plurality of layers of bit lines BL and a plurality of layers of word lines WL may alternately be stacked with the memory cells MC arranged between them.

FIG. 2 is a circuit diagram showing an example of the arrangement of the memory cell array according to the first embodiment.

As shown in FIG. 2, in the memory cell array, each memory cell MC is electrically connected to one of the bit lines BL0 to BL2 and one of the word lines WL0 to WL2 and accessed at random.

Each memory cell MC includes the variable resistance element 25 and a diode 22 which are connected in series. One end of the current path of the variable resistance element 25 is electrically connected to one of the bit lines BL0 to BL2, and the other end of the current path is electrically connected to the cathode of the diode 22. The anode of the diode 22 is electrically connected to one of the word lines WL0 to WL2.

One-end sides of the word lines WL0 to WL2 are electrically connected to a row decoder 11. One-end sides of the bit lines BL0 to BL2 are electrically connected to a column gate 12.

A write (set) operation is performed by applying a voltage to the variable resistance element 25 of the selected memory cell MC and thus generating a voltage gradient in the selected variable resistance element 25 to flow a current. For example, when performing the set operation in the memory cell MC at the intersection the word line WL1 and the bit line BL1 in FIG. 2, for example, a voltage of 3 V is applied to the word line WL1, and the ground potential is applied to the bit line BL1. At the same time, for example, the ground potential is applied to the word lines WL0 and WL2, and the voltage of 3 V is applied to the bit lines BL0 and BL2. At this time, if the diode 22 is absent, a reverse bias is applied to the memory cells MC other than the memory cell MC at the intersection of the word line WL1 and the bit line BL1, and an erase (reset) operation occurs. That is, the diode 22 makes the current flow to the memory cell MC in a predetermined direction, thereby enabling the cross-point memory structure.

Note that all the word lines WL0 to WL2 and all the bit lines BL0 to BL2 are preferably precharged at the time of standby before the data write operation.

A read operation is performed by, for example, applying a voltage pulse to the variable resistance element 25 of the selected memory cell MC and causing a sense amplifier (not shown) to detect a current determined by the resistance of the memory cell MC. The voltage pulse preferably has a small amplitude so that the material of the variable resistance element 25 causes no change of state.

An erase operation is performed by, for example, Joule-heating the variable resistance element 25 of the selected memory cell MC by a large current pulse and thus promoting an oxidation-reduction reaction in the variable resistance element 25.

[Example of Arrangement and Operation of Memory Cell MC]

An example of the arrangement and operation of the memory cell MC according to the first embodiment will be described below with reference to FIGS. 3, 4, 5 and 6.

FIG. 3 is a sectional view taken along a line A-A in FIG. 1, and illustrates an example of the arrangement of the memory cell MC according to the first embodiment. Two memory cells MC adjacent in the row direction will be explained here.

As shown in FIG. 3, each memory cell MC is arranged between the bit line BL and the word line WL. The memory cell MC includes a first lower electrode 21, the diode 22, a first upper electrode 23, a second lower electrode 24, the variable resistance element a second upper electrode 26, and a hard mask 27.

The first lower electrode 21 is formed on the bit line BL. The first lower electrode 21 is formed from a conductive film of, for example, TiN, N, TaN, or the like or a stacked film thereof.

The diode 22 is formed on the first lower electrode 21. As the diode 22, for example, an Si—PIN diode including, from the lower side, a p-type impurity doped Si film (P-doped Si film 22-1), an Si film doped with no impurity or an Si film lightly doped with an impurity (undoped Si film 22-2), and an n-type impurity doped Si film (N-doped Si film 22-3) is used.

Note that the diode 22 is not limited to the PIN diode, and may be a tunnel diode such as an SIS (Silicon Insulator Silicon) diode (including a P-doped Si film, a tunnel oxide film, and an N-doped Si film from the lower side).

The first upper electrode 23 is formed on the diode 22. The first upper electrode 23 is formed from, for example, a silicide film. However, the first upper electrode 23 need not always be formed from this film and may be formed from various kinds of conductive films.

The second lower electrode 24, the variable resistance element 25, and the second upper electrode 26 are formed on the first upper electrode 23. Details of the second lower electrode 24, the variable resistance element 25, and the second upper electrode 26 will be described later.

The hard mask 27 is formed on the second upper electrode 26. The hard mask 27 functions as a mask when etching the second upper electrode 26, the variable resistance element 25, the second lower electrode 24, the first upper electrode 23, the diode 22, and the first lower electrode 21 in the manufacturing step to be described later. The hard mask 27 is formed from a conductive film. Hence, the hard mask 27 need not be removed and can electrically be connected to the second upper electrode 26 formed below and the word line WL formed above.

In the row direction, the bit line BL is insulated and isolated by an interlayer dielectric film 31, and the memory cell MC (first lower electrode 21, diode 22, first upper electrode 23, second lower electrode 24, variable resistance element 25, second upper electrode 26, and hard mask 27) is insulated and isolated by an interlayer dielectric film 32.

FIG. 4 is a partially enlarged view of FIG. 3 and a sectional view showing an example of the arrangement of the variable resistance element 25 according to the first embodiment.

As shown in FIG. 4, the second lower electrode 24 is formed under the variable resistance element 25. The second lower electrode 24 is formed from, for example, a conductive alloy film of TiN or the like doped with oxygen (O). However, the second lower electrode 24 need not always be formed from this film, and need only be formed from a conductive film capable of supplying oxygen (O) to the variable resistance element 25 in the reset operation.

Hence, the second lower electrode 24 may be formed from, for example, a conductive alloy film of TaN, TiC, TaC, or the like doped with oxygen (O), or a conductive metal film of Pt, Pd, or the like doped with oxygen (O). The second lower electrode 24 may be formed from, for example, a conductive metal oxide film of $RuO_X$, $PtO_X$, $InO_X$, $InSnO_X$, $SnO_X$, $IrO_X$, $RhO_X$, or the like. The oxygen (O) concentration in the second lower electrode 24 is 5 atoms % or less.

The variable resistance element 25 is formed on the second lower electrode 24 and includes a stacked film of the first film 25-1 and the second film 25-2.

The first film 25-1 is formed on the second lower electrode 24 and located at the lower portion of the variable resistance element 25 (on the side of the second lower electrode 24). The first film 25-1 is formed from an insulating metal oxide film or an insulating semiconductor oxide film. As the insulating metal oxide film, an oxide film of a group V element such as a $V_2O_5$, $Nb_2O_5$, or $Ta_2O_5$ film, an oxide film of a group IV element such as a $TiO_2$, $ZrO_2$, or $HfO_2$ film, or an oxide film of a group IV element such as an $La_2O_3$, $Al_2O_3$, $LaAlO_X$, or MgO film is usable. As the insulating semiconductor oxide film, an oxide film such as an $SiO_X$, $GeO_X$, or $SiGeO_X$ film is usable. Instead of the insulating metal oxide film or insulating semiconductor oxide film, the first film 25-1 may be formed from an insulating silicate film (an insulating film made of a compound of $SiO_X$ and a metal oxide).

The material of the first film 25-1 has insulating properties in a state without oxygen (O) deficiency. In the first embodiment, the first film 25-1 has oxygen deficiency. In the set operation, the metal element diffuses into a region where the deficiency density is high, thereby forming a filament and forming the low resistance state. In the reset operation, oxygen (O) is supplied to the oxygen deficiency region, thereby forming the high resistance state.

The metal, material or semiconductor material of the first film 25-1 is readily bonded to oxygen (O). More specifically, the bond energy between oxygen (O) and the metal material or semiconductor material of the first film 25-1 is equal to or larger than the bond energy between Si and oxygen (O). In other words, the decrease amount of the Gibbs standard free energy when oxygen (O) and the metal material or semiconductor material of the first film 25-1 are bonded is equal to or larger than the decrease amount of the Gibbs standard free energy when Si and oxygen (O) are bonded. Hence, when oxygen (O) is supplied to the first film 25-1 in the reset operation, the variable resistance element 25 easily attains the high resistance.

The film thickness of the first film 25-1 is, for example, 3 nm or less. When the first film 25-1 is made as thin as, for example, 3 nm or less, the oxygen deficiency can be formed in the first film 25-1. The first film 25-1 can form a narrow filament (having a width of, for example, 10 nm or less) in a region where the oxygen deficiency density is relatively high. Oxygen deficiency indicates a state in which the composition ratio of the oxygen element to the metal element or semiconductor element is short in the insulating metal oxide film or insulating semiconductor oxide film of the first film 25-1.

The second film 25-2 is formed on the first film 25-1 and located at the upper portion of the variable resistance element 25 (on the side of the second upper electrode 26). The second film 25-2 is formed from a sulfide film or a selenium (Se) compound film. As the sulfide film, a sulfide film such as a $Cu_2S$, $Ag_2S$, $GeS_X$, $SiS_X$, or $CS_X$ film is usable. As the Se compound film, selenium (Se) compound film such as a $Cu_2Se$, $Ag_2Se$, $GeSe_X$, $SiSe_X$, or $CSe_X$ film is usable.

The atomic density of the material of the second film 25-2 is lower than those of the materials of an $SiO_X$ film and the first film 25-1. For this reason, the diffusion coefficient of the metal element in the second film 25-2 is larger than the diffusion coefficient of the metal element in a thermal oxide film ($SiO_X$ film), and more preferably, larger than the diffusion coefficient of the metal element in the first film 25-1. In other words, diffusion of the metal element contained in the second upper electrode 26 is easier in the second film 25-2 than in the first film 25-1 or $SiO_X$ film.

The electronegativity of the selenium (Se) element or sulfur (S) element of the second film 25-2 is higher than the electronegativity of the metal element contained in the second upper electrode 26. Hence, the second film 25-2 receives electrons from the metal element contained in the second upper electrode 26 and ionizes the metal element.

The film thickness of the second film 25-2 is, for example, about 3 nm to 20 nm.

In the variable resistance element 25, the resistance value of the first film 25-1 is higher than that of the second film 25-2 in the high resistance state and the low resistance state. For this reason, the resistance ratio of set (low resistance state)/ reset (high resistance state) is determined mainly by the resistance value of the first film 25-1.

The second upper electrode 26 is formed on the second film 25-2. The second upper electrode 26 is formed from a metal film of Cu, Ag, Au, Ru, or the like. In the set operation, the metal element of the second upper electrode 26 ionizes and diffuses into the second film 25-2.

Note that the memory cells MC alternately change their structure between layers, although not illustrated. More specifically, the first lower electrode 21, the diode 22, the first upper electrode 23, the second upper electrode 26, the variable resistance element 25, and the second lower electrode 24 are sequentially formed on the word lines WL. That is, the second upper electrode 26 and the second lower electrode 24 change the places. Despite their names, the second upper electrode 26 is located on the lower side of the variable resistance element 25, and the second lower electrode 24 is located on the upper side of the variable resistance element 25.

In addition, the diode 22 has a structure in which the N-doped Si film 22-3, the undoped Si film 22-2, and the P-doped Si film 22-1 are sequentially formed from the lower side (the side of the first lower electrode 21). The variable resistance element 25 has a structure in which the second film 25-2 and the first film 25-1 are sequentially formed from the lower side (the side of the second upper electrode 26).

Figure 5:
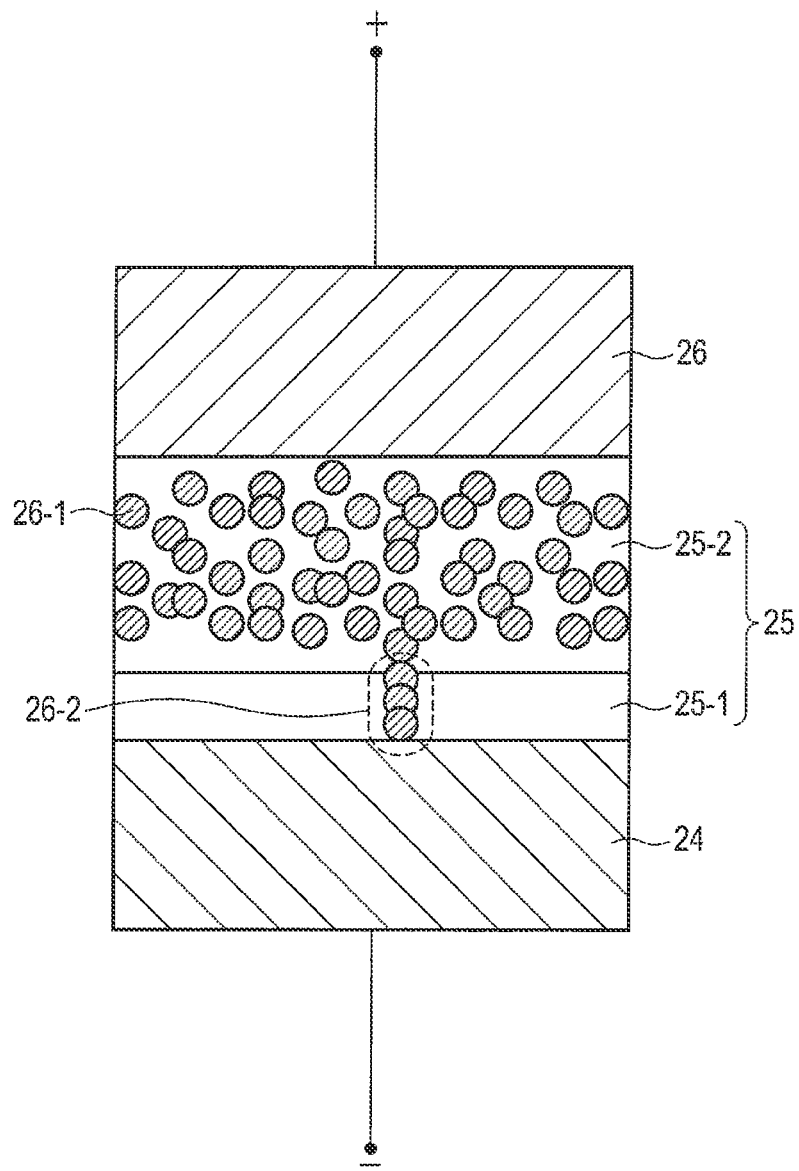
FIG. 5 is a sectional view showing an example of the set operation (low resistance state) of the memory cell according to the first embodiment.

FIG. 5 is a sectional view showing an example of the set operation (low resistance state) of the memory cell MC according to the first embodiment.

As shown in FIG. 5, in the set operation, a bias is applied, to the variable resistance element 25 using the second lower electrode 24 as the cathode and the the second upper electrode 26 as the anode. The metal element of the second upper electrode 26 diffuses into the second film 25-2. As described above, the second film 25-2 ionizes the metal element and diffuses it to a wide region. For this reason, the metal element changes to metal ions 26-1 and widely diffuses in the second film 25-2. The metal ions 26-1 diffuse up to the interface between the second film 25-2 and the first film 25-1.

The metal ions 26-1 then diffuse into the first film 25-1. At this time, the metal ions 26-1 diffuse into a region where the oxygen deficiency density is relatively high in the first film 25-1. The metal ions 26-1 thus form a filament (conducting region) 26-2 in a narrow region having a width of, for example, 10 nm or less, and preferably, 5 nm or less. In this way, the low resistance state of the variable resistance element 25 according to the first embodiment is formed.

On the other hand, in the reset operation, a reverse bias is applied to the variable resistance element 25 using the second upper electrode 26 as the cathode and the second lower electrode 24 as the anode. The filament 26-2 (metal ions 26-1) in the first film 25-1 moves backward to the side of the second upper electrode 26. The metal ions 26-1 in the second film 25-2 also move backward to the side of the second upper electrode 26. In this way, the high resistance state of the variable resistance element 25 according to the first embodiment is formed.

At this time, simultaneously, oxygen (O) is supplied from the second lower electrode 24 to the first film 25-1. As described above, the first film 25-1 is readily bonded to oxygen (O), and bonding with oxygen (O) boosts the insulating properties. For this reason, at the time of reset, the variable resistance element 25 (first film 25-1) can more easily change to the high resistance state.

Note that in the variable resistance element 25 in the high resistance state and the low resistance state, the resistance value of the first film 25-1 is higher than that of the second film 2. For this reason, the resistance value (resistance change amount) of the entire variable resistance element 25 is determined by the resistance value of the first film 25-1.

Figure 6:
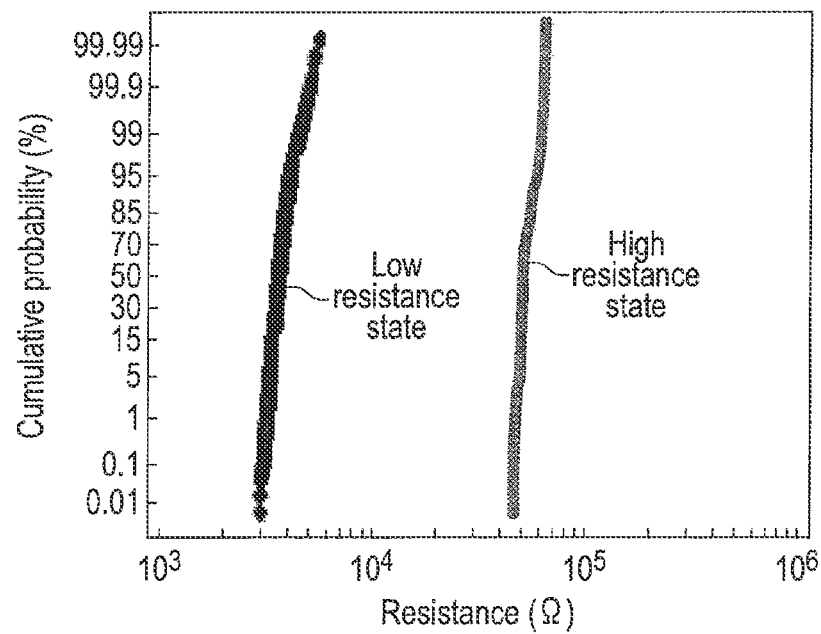
FIG. 6 is a graph showing an example of the relationship between the resistance value and the cumulative probability in the high resistance state and the low resistance state of the memory cell according to the first embodiment.

FIG. 6 is a graph showing an example of the relationship between the resistance value and the cumulative probability in the high resistance state and the low resistance state of the memory cell MC according to the first embodiment.

As shown in FIG. 6, in the semiconductor device according to the first embodiment, the resistance variation between the memory cells MC becomes small in the high resistance state and the low resistance state. More specifically, in the high resistance state and the low resistance state, the resistance variation between the memory cells MC can be suppressed to 10% or less. Additionally, even when set and reset are repetitively performed, the reproducibility of the resistance change between the low resistance state and the high resistance state can be improved.

[Manufacturing Method of Memory Cell MC]

A manufacturing method of the memory cell MC according to the first embodiment will be described below with reference to FIGS. 7, 8, 9, and 10.

FIGS. 7, 8, 9, and 10 are sectional views showing taken along a line A-A in FIG. 1 and sectional views showing example of steps in the manufacture of the memory cell MC according to the first embodiment.

Figure 7:
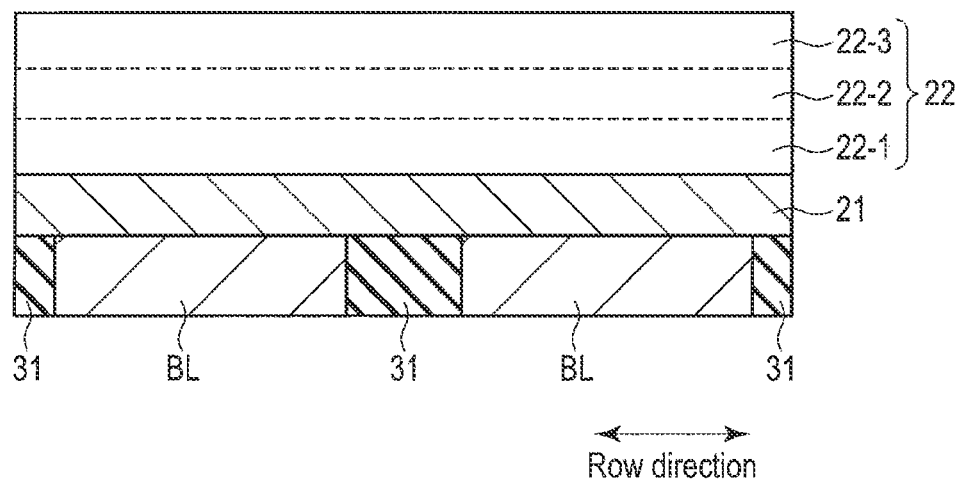
FIGS. 7, 8, 9, and 10 are sectional views showing example of steps in the manufacture of the memory cell according to the first embodiment.

First, as shown in FIG. 7, after a circuit for operating the cell portion, a contact, and an interlayer dielectric film (none are shown) are formed, a bit line BL is formed on them. The hit line BL is etched and divided in the row direction. The bit lines BL thus extend in the column direction and are arranged in parallel to each other. After that, an interlayer dielectric film 31 is formed between the bit lines BL.

Next, a first lower electrode 21 is formed on the interlayer dielectric film 31. The first lower electrode 21 is formed from a conductive film of, for example, TiN, N, TaN, or the like or a stacked film thereof.

A diode 22 is formed on the first lower electrode 21. More specifically, a P-doped Si film 22-1, an undoped Si film 22-2, and a N-doped Si film 22-3 are continuously formed on the first lower electrode 21 while keeping the amorphous state in situ. An Si—PIN diode is thus formed as the diode 22.

Figure 8:
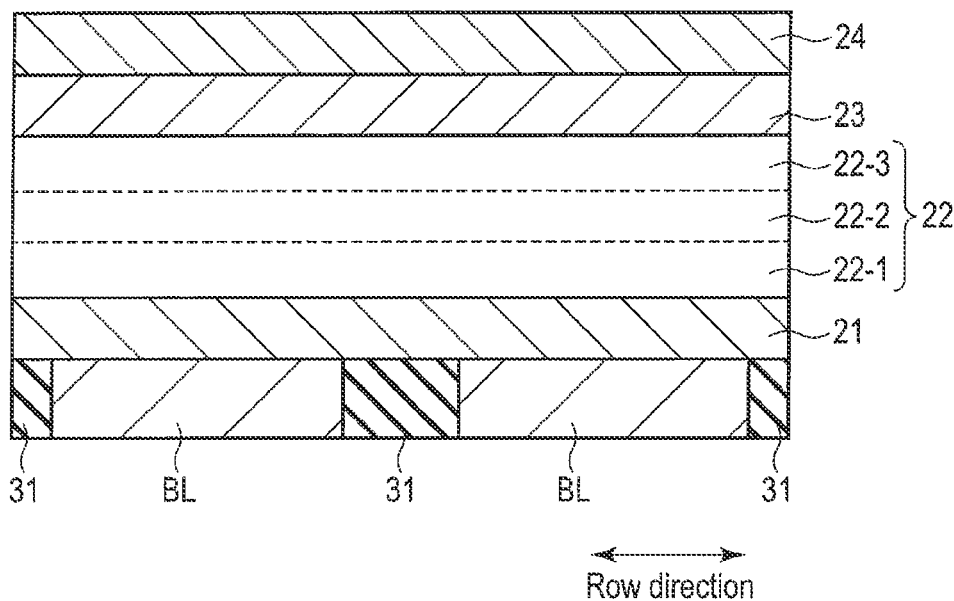

As shown in FIG. 8, a first upper electrode 23 that reduces the interface resistance is formed on the diode 22. As the first upper electrode 23, a metal film of, for example, Ti that silicidizes is formed and annealed at about 500° C. (inclusive) to 700° C. (inclusive), thereby forming a silicide film.

Next, a second lower electrode 24, a variable resistance element 25, and a second upper electrode 28 are formed on the first upper electrode 23. The second lower electrode 24, the variable resistance element 25, and the second upper electrode 26 are formed in the following way.

(1) First, the second lower electrode 24 is formed on the first upper electrode 23. The second lower electrode 24 can be formed from, for example, a conductive alloy film of TiN, TaN, TIC, TaC, or the like doped with oxygen (O), or a conductive metal film of Pt, Pd, or the like doped with oxygen (O) The second lower electrode 24 may be formed from, for example, a conductive metal oxide film of $RuO_x$, $PtO_x$, $InO_x$, $InSnO_x$, $SnO_x$, $IrO_x$, $RhO_x$, or the like.

When the second lower electrode 24 is a conductive alloy film or a conductive metal film doped with oxygen (O), a conductive alloy film or a conductive metal film is formed by, for example, CVD (Chemical Vapor Deposition) and doped with oxygen (O) by, for example, ion implantation, thereby forming the second lower electrode 24.

On the other hand, when the second lower electrode 24 is a conductive metal oxide film, it is formed by, for example, CVD.

Figure 9:
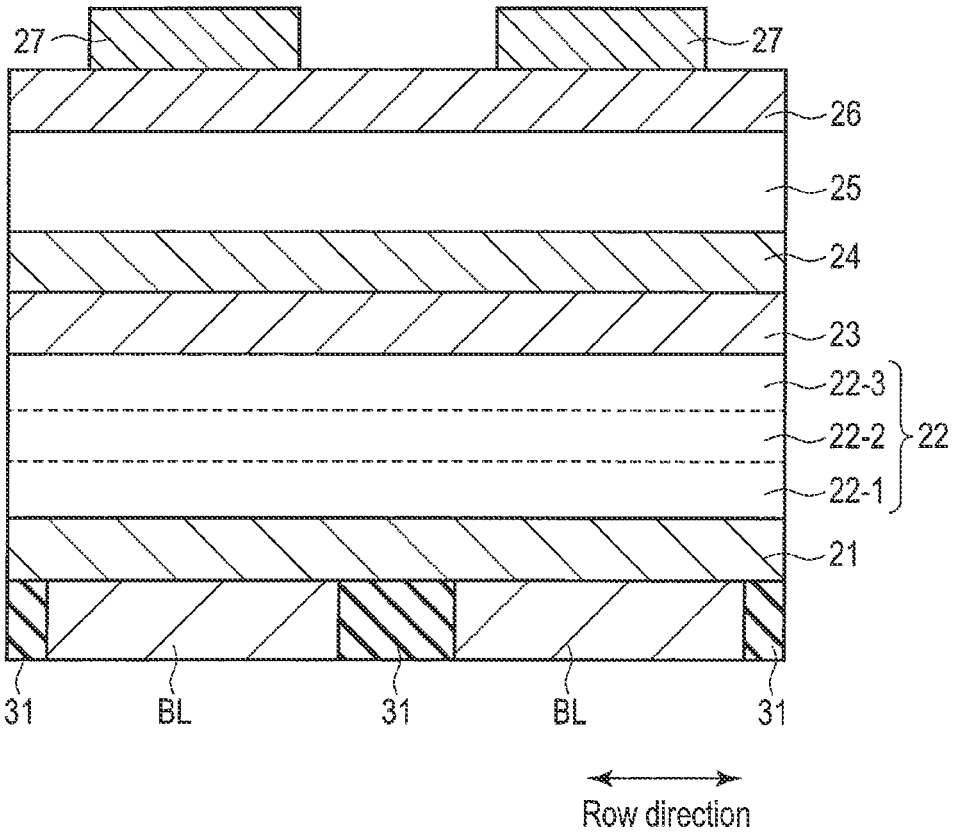

(2) Next, as shown in FIG. 9, the variable resistance element 25 including a first film 25-1 and a second film 25-2 is formed on the second lower electrode 24.

More specifically, the first film 25-1 is formed on the second lower electrode 24 by, for example, CVD. The first film 25-1 is formed from an insulating metal oxide film, an insulating semiconductor oxide film, or an insulating silicate film.

The film thickness of the first film 25-1 is, for example, 3 nm or less. When the first film 25-1 is made as thin as, for example, 3 nm or less, oxygen deficiency can be formed in the first film 25-1.

Next, the second film 25-2 is formed on the first film 25-1 by, for example, CVD. The first film 25-1 is formed from a sulfide film or selenium (Se) compound film. The metal element contained in the second upper electrode 26 diffuses in a wide region of the second film 25-2 than in the first film 25-1 or an $SiO_X$ film. The second film 25-2 ionizes the metal element contained in the second upper electrode 26.

(3) Next, the second upper electrode 25 is formed on the second film 25-2 by, for example, CVD. The second upper electrode 26 is formed from a metal film of Cu, Ag, Au, Ru, or the like. In the set operation, the metal element, of the second upper electrode 26 ionizes and diffuses into the second film 25-2.

By the above-described steps (1) to (3), the second lower electrode 24, the variable resistance element 25, and the second upper electrode 26 according to the first embodiment are formed.

Next, a hard mask 27 is formed on the second upper electrode 26 and patterned. The hard mask 27 is formed from a conductive film.

Figure 10:
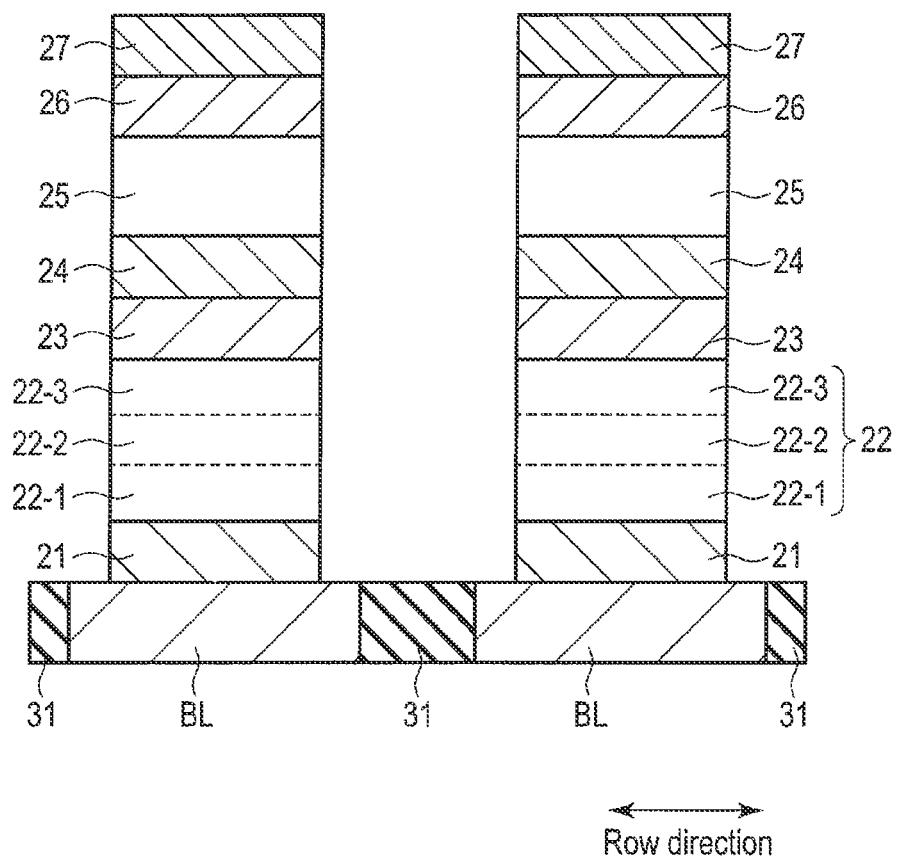

As shown in FIG. 10, the second upper electrode 26, the variable resistance element 25, the second lower electrode 24, the first upper electrode 23, the diode 22, and the first lower electrode 21 are etched using the hard mask 27 as a mask. The memory cell MC (second upper electrode 26, variable resistance element 25, second lower electrode 24, first upper electrode 23, diode 22, and first lower electrode 21) is thus divided in the row direction.

Next, as shown in FIG. 3, an interlayer dielectric film 32 is formed between the memory cells MC in the row direction. Annealing is performed at 700° C. (inclusive) to 900° C. (inclusive), thereby crystallizing and activating the diode 22. After that, a word line WL is formed on the memory cells MC and the interlayer dielectric film 32. Then, the word line WL and the memory cells MC are etched and divided in the column direction.

The cross-point memory cell MC according to the first embodiment is formed in the above-described way.

[Effects]

Figure 11:
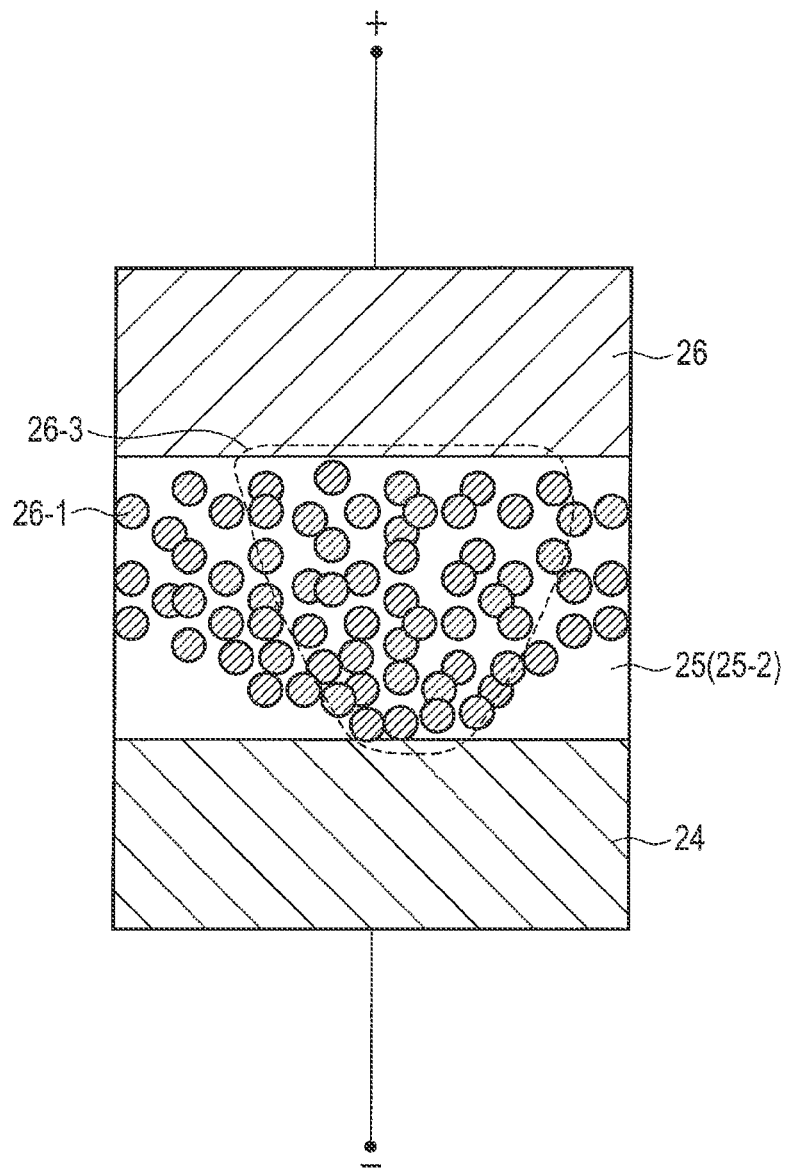
FIG. 11 is a sectional view showing an example of the set operation (low resistance state) of a memory cell according to Comparative Example 1.
Figure 12:
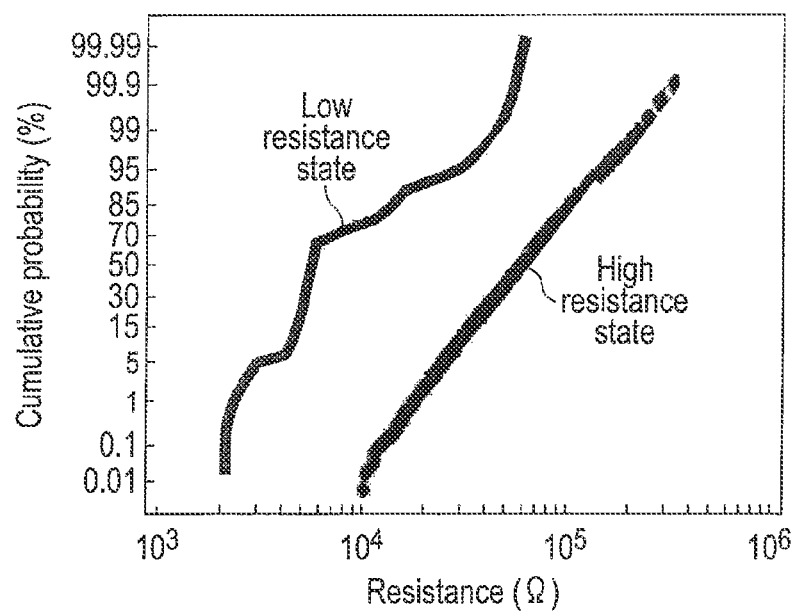
FIG. 12 is a graph showing an example of the relationship between the resistance value and the cumulative probability in the high resistance state and the low resistance state of the memory cell according to Comparative Example 1.

FIG. 11 is a sectional view showing an example of the set operation (low resistance state) of a memory cell according to Comparative Example 1. FIG. 12 is a graph showing an example of the relationship between the resistance value and the cumulative probability in the high resistance state and the low resistance state of the memory cell according to Comparative Example 1.

As shown in FIG. 11, in Comparative Example 1, the variable resistance element 25 is formed from the second film 25-2 of a single layer including a sulfide film or selenium (Se) compound film.

When a bias is applied to the variable resistance element 25 in the set operation according to Comparative Example 1, the metal ions 26-1 diffuse in the entire variable resistance element 25 (second film 25-2). For this reason, a filament (conducting region) 26-3 is formed in a wide region having a width of, for example, 10 nm or more in the second film 25-2. As a result, the filament size largely varies depending on the place (between cells). Hence, the resistance value in the low resistance state varies between the memory cells MC, as shown in FIG. 12.

In addition, since the metal ions 26-1 diffuse in the entire second film 25-2 in the low resistance state, it is difficult to move the metal ions 26-1 backward to obtain the high resistance state. For this reason, the resistance value in the high resistance state also varies between the memory cells MC due to repetitive use, as shown in FIG. 12.

To the contrary, according to the first embodiment, the variable resistance element 25 is formed from a stacked film of the first film 25-1 including an insulating metal oxide film or an insulating semiconductor oxide film, and the second film 25-2 including a sulfide film or selenium (Se) compound film. The metal ions 26-1 widely diffuse in the second film 25-2. On the other hand, the first film 25-1 has an oxygen deficiency region, and the metal ions 26-1 narrowly diffuse in a region where the oxygen deficiency density is high.

As shown in FIG. 5, when a bias is applied to the variable resistance element 25 in the set operation according to the first embodiment, the metal ions 26-1 can diffuse in the entire second film 25-2, and after that, the filament 26-2 can be formed in a narrow region of the first film 25-1. This can reduce the variation in the filament size. It is therefore possible to reduce the variation in the resistance value in the low resistance state between the memory cells MC as compared to Comparative Example 1, as shown in FIG. 6.

In the low resistance state, the metal ions 26-1 diffuse in a narrow region of the first film 25-1, and the filament 26-2 is formed. Hence, in the reset operation, the metal ions 26-1 can easily be moved backward to obtain the high resistance state. It is therefore possible to reduce the variation in the resistance value in the high resistance state between the memory cells MC as compared to Comparative Example 1 even when set and reset are repetitively performed, as shown in FIG. 6. This makes it possible to improve the reproducibility of the resistance change between the low resistance state and the high resistance state.

In the first embodiment, the first film 25-1 is made of a material that is readily bonded to oxygen (O) and boosts the insulating properties when bonded to O. The second lower electrode 24 is made of a material capable of supplying oxygen (O) to the first film 25-1 in the reset operation. Hence, in the reset operation, the first film 25-1 can more easily change to the high resistance state by obtaining oxygen (O) from the second lower electrode 24.

Note that the same metal element (Cu, Ag, Au, Ru, or the like) as in the second upper electrode 26 may be added to the second film 25-2 in advance. This facilitates diffusion of the metal ions 26-1 from the second film 25-2 to the first film 25-1, And the low resistance state can be formed in a shorter time. The second film 25-2 can be formed by implanting the metal element by, for example, ion implantation upon forming the second film 25-2.

Second Embodiment

A semiconductor device (ReRAM) according to the second embodiment will be described with reference to FIGS. 13, 14, 15, and 16. In the second embodiment, a variable resistance element 25 is formed from a stacked film of a first film 25-1 including an insulating metal oxide film or an insulating semiconductor oxide film, a third film 25-3 including a porous semiconductor film, and a fourth film 25-4 containing oxygen (O), nitrogen (N), or fluorine (F). This makes it possible to reduce the resistance variation between memory cells MC caused by microfabrication and also improve the reproducibility of a resistance change between a low resistance state and a high resistance state. The second embodiment will be described below in detail.

Note that in the second embodiment, a description of the same points as in the first embodiment will be omitted, and different points will mainly be explained.

[Example of Arrangement and Operation of Memory Cell MC]

An example of the arrangement and operation of the memory cell MC according to the second embodiment will be described below with reference to FIGS. 13 and 14.

Figure 13:
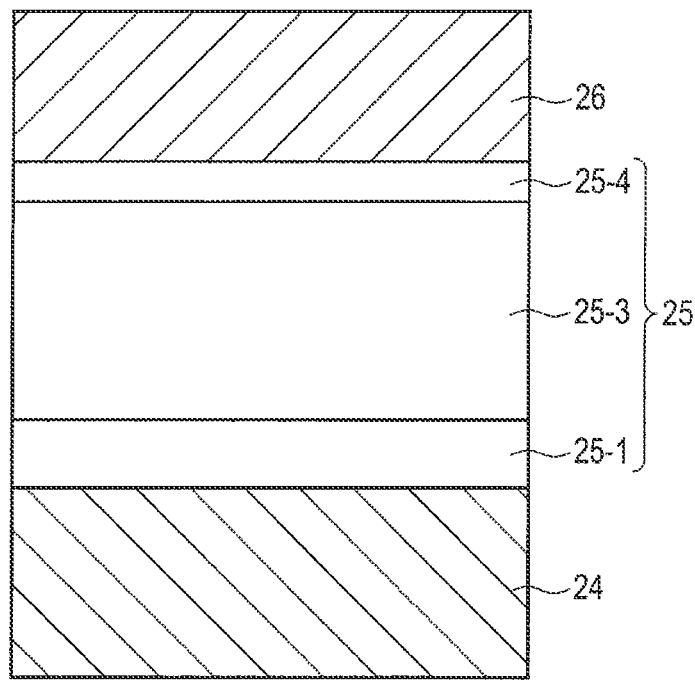
FIG. 13 is a sectional view showing an example of the arrangement of a variable resistance element according to the second embodiment.

FIG. 13 is a partially enlarged view of FIG. 3 and a sectional view showing an example of the arrangement of the variable resistance element 25 according to the second embodiment.

As shown in FIG. 13, a second lower electrode 24 is formed under the variable resistance element 25. The second lower electrode 24 is formed from, for example, a conductive alloy film of TiN or the like doped with oxygen (O). However, the second lower electrode 24 need not always be formed from this film, and need only be formed from a conductive film capable of supplying oxygen (O) to the variable resistance element 25 in the reset operation.

The variable resistance element 25 is formed on the second lower electrode 24 and includes a stacked film of the first film 25-1, the third film 25-3, and the fourth film 25-4.

The first film 25-1 is formed on the second lower electrode 24 and located at the lower portion of the variable resistance element 25 (on the side of the second lower electrode 24). The first film 25-1 is formed from an insulating metal oxide film or an insulating semiconductor oxide film.

The third film 25-3 is formed on the first film 25-1 and located at the center of the variable resistance element 25. The third film 25-3 is formed from a porous semiconductor film. As the porous semiconductor film, a semiconductor film such as an Si, SiGe, SiC, or C film or a porous film including cavities having a diameter of 5 nm or less, and more preferably, 1 nm (inclusive) to 3 nm (inclusive) is usable.

Since the third film 25-3 is a porous semiconductor film, a metal element diffuses in the cavity portions. For this reason, the diffusion coefficient of the metal element in the third film 25-3 is larger than the diffusion coefficient of the metal element in a thermal oxide film ($SiO_X$ film), and more preferably, larger than the diffusion coefficient of the metal element in the first film 25-1. In other words, diffusion of the metal element contained in an second upper electrode 26 is easier in the third film 25-3 than in the first film 25-1 or $SiO_X$ film.

The fourth film 25-4 is formed on the third film 25-3 and located at the upper portion of the variable resistance element 25 (on the side of the second upper electrode 26). The fourth film 25-4 is formed from a film containing O, F, and N. As the film containing O, F, and N, for example, a film of $SiO_X$, $SiF_X$, or $SiN_X$ is usable. The material is not limited to this, and an Si film doped with O, F, or N may be used.

The electronegativity of the O element, F element, or N element contained in the fourth film 25-4 is 3.0 or more and is higher than the electronegativity of the metal element contained in the second upper electrode 26. Hence, the fourth film 25-4 receives electrons from the metal element contained in the second upper electrode 26 and ionizes the metal element.

Note that the electronegativity of the element contained in the fourth film 25-4 is preferably 3.5 or more. Hence, the fourth film 25-4 more preferably contains the oxygen (O) element or fluorine (F) element.

The film thickness of the fourth film 25-4 is, for example, about 0.3 nm (inclusive) to 3.0 nm (inclusive). The lower limit defines the range necessary to sufficiently ionize the metal element contained in the second upper electrode 26. On the other hand, the upper limit defines the range necessary to make the resistance of the fourth film 25-4 so small as to be negligible.

In the variable resistance element 25, the resistance value of the first film 25-1 is higher than those of the third film 25-3 and the fourth film 25-4 in the high resistance state and the low resistance state. For this reason, the resistance ratio of set (low resistance state)/reset (high resistance state) is determined mainly by the resistance value of the first film 25-1.

The second upper electrode 26 is formed on the fourth film 25-4. The second upper electrode 26 is formed from a metal film of Cu, Ag, Au, Ru, or the like. In the set operation, the metal element of the second upper electrode 26 ionizes and diffuses into the fourth film 25-4 and then diffuses in the third film 25-3 while keeping ionizing.

Note that the memory cells MC alternately change their structure between layers, although not illustrated. More specifically, a first lower electrode 21, a diode 22, a first upper electrode 23, the second upper electrode 26, the variable resistance element 25, and the second lower electrode 24 are sequentially formed on word lines WL. That is, the second upper electrode 26 and the second lower electrode 24 change the places. The variable resistance element 25 has a structure in which the fourth film 25-4, the third film 25-3, and the first film 25-1 are sequentially formed from the lower side (the side of the second upper electrode 26).

Figure 14:
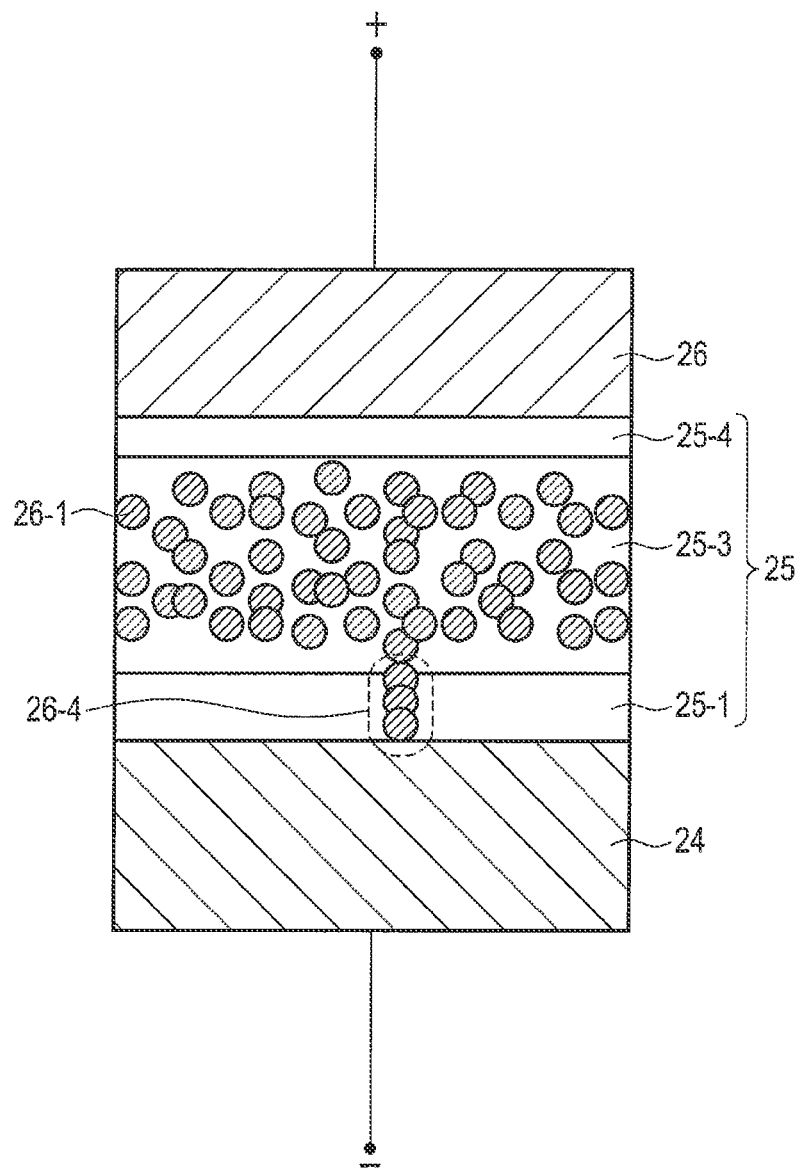
FIG. 14 is a sectional view showing an example of the set operation (low resistance state) of a memory cell according to the second embodiment.

FIG. 14 is a sectional view showing an example of the set operation (low resistance state) of the memory cell MC according to the second embodiment.

As shown in FIG. 14, in the set operation, a bias is applied to the variable resistance element 25 using the second lower electrode 24 as the cathode and the second upper electrode 26 as the anode. The metal element of the second upper electrode 26 diffuses into the fourth film 25-4. As described above, the fourth film 25-4 ionizes the metal element. For this reason, the metal element changes to metal ions 26-1 in the fourth film 25-4. The metal ions 26-1 diffuse in the third film 25-3. The third film 25-3 diffuses the metal element in a wide region, as described above. Hence, the metal ions 26-1 widely diffuse in the third film 25-3. The metal ions 26-1 diffuse up to the interface between the third film 25-3 and the first film 25-1.

The metal ions 26-1 then diffuse into the first film 25-1. At this time, the metal ions 26-1 diffuse into a region where the oxygen deficiency density is relatively high in the first film 25-1. The metal ions 26-1 thus form a filament (conducting region) 26-4 in a narrow region having a width of, for example, 10 nm or less, and preferably, 5 nm or less. In this way, the low resistance state of the variable resistance element 25 according to the second embodiment is formed.

On the other hand, in the reset operation, a reverse bias is applied to the variable resistance element 25 using the second upper electrode 26 as the cathode and the second lower electrode 24 as the anode. The filament 26-2 (metal ions 26-1) in the first film 25-1 moves backward to the side of the second upper electrode 26. The metal ions 26-1 in the third film 25-3 also move backward to the side of the second upper electrode 26. In this way, the high resistance state of the variable resistance element 25 according to the first embodiment is formed.

At this time, simultaneously, oxygen (O) is supplied from the second lower electrode 24 to the first film 25-1. As described above, the first film 25-1 is readily bonded to oxygen (O), and bonding with oxygen (O) boosts the insulating properties. For this reason, at the time of reset, the variable resistance element 25 (first film 25-1) can more easily change to the high resistance state.

Note that in the variable resistance element 25 in the high resistance state and the low resistance state, the resistance value of the first film 25-1 is higher than those of the third film 25-3 and the fourth film 25-4. For this reason, the resistance value (resistance change amount) of the entire variable resistance element 25 is determined by the resistance value of the first film 25-1.

As in FIG. 6 of the first embodiment, in the semiconductor device according to the second embodiment, the resistance variation between the memory cells MC becomes small in the high resistance state and the low resistance state. More specifically, in the high resistance state and the low resistance state, the resistance variation between the memory cells MC can be suppressed to 10% or less. Additionally, even when set and reset are repetitively performed, the reproducibility of the resistance change between the low resistance state and the high resistance state can be improved.

[Manufacturing Method of Memory Cell MC]

A manufacturing method of the memory cell MC according to the second embodiment will be described below.

First, a bit line BL, a first lower electrode 21, a diode 22, and a first upper electrode 23 are sequentially formed, as in the first embodiment.

Next, a second lower electrode 24, a variable resistance element 25, and a second upper electrode 26 are formed on the first upper electrode 23. The second lower electrode 24, the variable resistance element 25, and the second upper electrode 26 are formed in the following way.

(1) First, the second lower electrode 24 is formed on the first upper electrode 23. The second lower electrode 24 can be formed from, for example, a conductive alloy film of TiN, TaN, TiC, TaC, or the like doped with oxygen (O), or a conductive metal film of Pt, Pd, or the like doped with oxygen (O). The second lower electrode 24 may be formed from, for example, a conductive metal oxide film of $RuO_X$, $PtO_X$, $InO_X$, $InSnO_X$, $SnO_X$, $IrO_X$, $RhO_X$, or the like.

(2) Next, the variable resistance element 25 including a first film 25-1, a third film 25-3, and a fourth film 25-4 is formed on the second lower electrode 24.

More specifically, the first film 25-1 is formed on the second lower electrode 24 by, for example, CVD. The first film 25-1 is formed from an insulating metal oxide film, an insulating semiconductor oxide film, or an insulating silicate film.

Next, the third film 25-3 is formed on the first film 25-1. The third film 25-3 is formed from a porous semiconductor film. The metal element contained in the second upper electrode 26 diffuses in a wide region of the third film 25-3 than in the first film 25-1 or an $SiO_X$ film.

The third film 25-3 formed from a porous semiconductor film is formed by generating a plasma of a source gas and irradiating a wafer with the plasma as on beams having a relatively small energy. Details of a manufacturing apparatus and method of the third film 25-3 will be described later.

The fourth film 25-4 is formed on the third film 25-3. The fourth film 25-4 is formed from, for example, an $SiO_X$, $SiF_X$, or $SiN_X$ film. The fourth film 25-4 need not always be formed from these films and may be formed from an Si film doped with O, F, or N.

When the fourth film 25-4 is an $SiO_X$, $SiF_X$, or $SiN_X$ film, it is formed by, for example, CVD.

On the other hand, when the fourth film 25-4 is an Si film doped with O, F, or N, it is formed by forming the Si film using, for example, CVD and implanting O, F, or N into the Si film by, for example, ion implantation.

(3) Next, the second upper electrode 26 is formed on the fourth film 25-4 by, for example, CVD. The second upper electrode 25 is formed from a metal film of Cu, Ag, Au, Ru, or the like. In the set operation, the metal element of the second upper electrode 26 ionizes and diffuses into the third film 25-3.

By the above-described steps (1) to (3), the second lower electrode 24, the variable resistance element 25, and the second upper electrode 26 according to the second embodiment are formed.

After that, a hard mask 27 and word lines WL are formed, as in the first embodiment.

The cross-point memory cell MC according to the second embodiment is formed in the above-described way.

[Manufacturing Apparatus of Third Film 25-3 (Porous Semiconductor Film)]

A manufacturing apparatus of the third film 25-3 according to the second embodiment will be described below with reference to FIG. 15.

Figure 15:
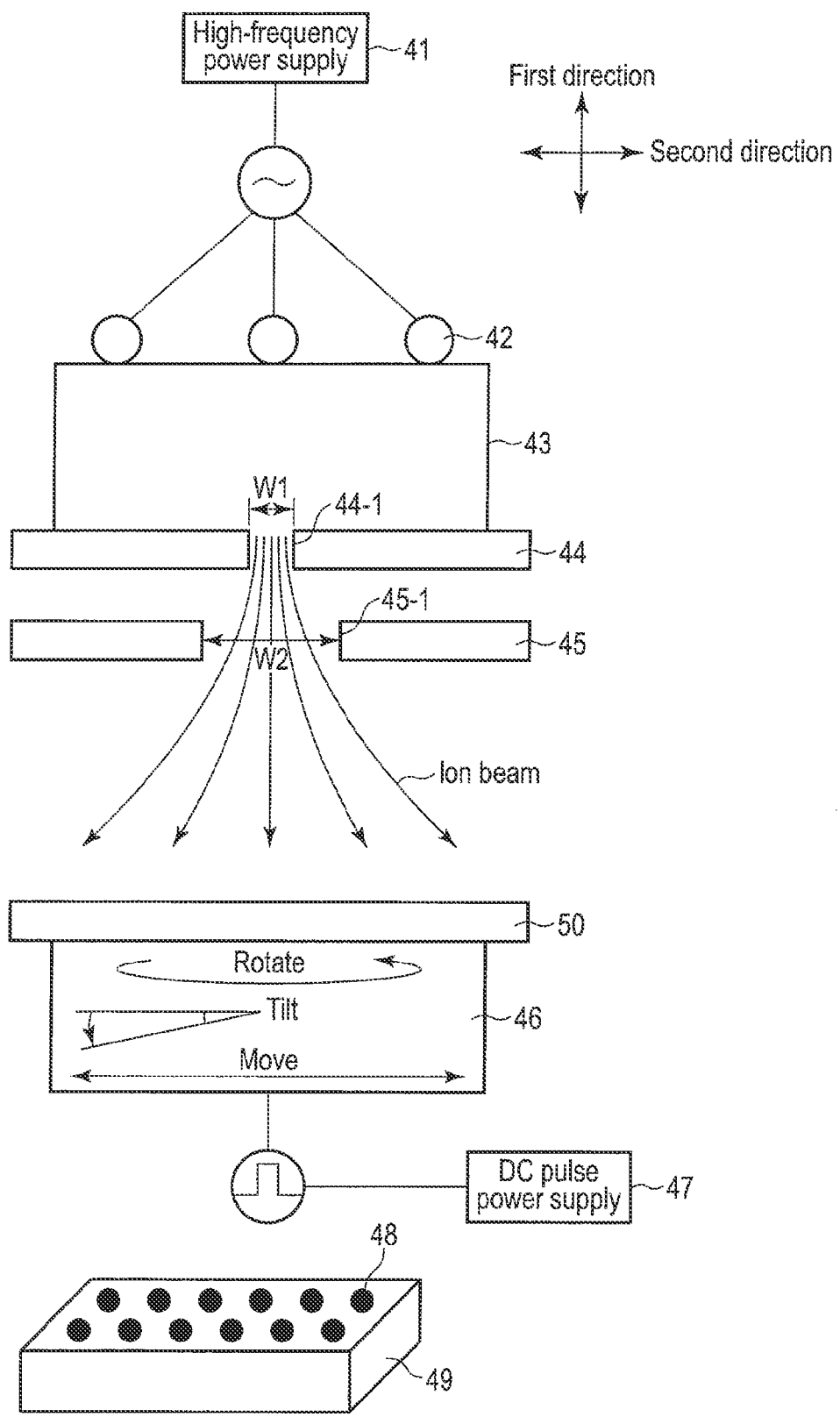
FIG. 15 is a view showing an example of a manufacturing apparatus of a third film according to the second embodiment.

FIG. 15 is a view showing the manufacturing apparatus of the third film 25-3 according to the second embodiment.

As shown in FIG. 15, the manufacturing apparatus according to the second embodiment includes an ion source chamber 43, a first aperture 44, a second aperture 45, an electrostatic chuck 46, and a Faraday cup array 49.

A source gas that is the material of the third film 25-3 flows to the ion source chamber 43. As the source gas, a semiconductor hydride has such as $SiH_4$, $Si_2H_6$, $Si_3H_8$, $CH_4$, $C_2H_6$, $C_3H_8$, or $GeH_4$ is usable. The ion source chamber 43 is provided with antennas 42. An electromagnetic wave of, for example, 13.56 MHz can be supplied from a high-frequency power supply 41 to the ion source chamber 43 via the antennas 42. This makes it possible to change the source gas in the ion source chamber 43 to a plasma and generate an ion plasma.

The high frequency supplied to the ion source chamber 43 is not limited to 13.56 MHz. A microwave of at least one frequency within the range of 2.45 GHz to 20 GHz may be supplied to the ion source chamber 43. In this case, the metal material of a waveguide for supplying the electromagnetic wave to the ion source chamber 43 may be sputtered. To prevent this, the surface of the metal material is preferably coated with Si or SiC.

The first aperture 44 is provided adjacent to the ion source chamber 43. The first aperture 44 is made of, for example, graphite and has a rectangular slit 44-1 having a width (size in the second direction in FIG. 15) W1 (for example, about 10 mm). Although not illustrated, the length (size in the direction perpendicular to the drawing surface in FIG. 15) of the slit 44-1 is about 400 mm (inclusive) to 600 mm (inclusive) and is set larger than the diameter of a wafer 50. A power supply (not shown) is connected to the first aperture 44. A voltage can be applied from the power supply to the first aperture 44. The first aperture 44 can extract the ion plasma in the ion source chamber 43 as ion beams and irradiates a wafer with them through the slit 44-1. At this time, the ion beams irradiating the wafer through the first aperture 44 are ion beams in a linear direction (the first direction perpendicular to the second direction).

The second aperture 45 is provided adjacent to the first aperture 44 in the ion beam irradiation direction. The second aperture 45 is made of, for example, graphite and has a rectangular slit 45-1 having a width W2 (for example, about 30 mm) larger than the width W1. Although not illustrated, the length of the slit 45-1 is about 400 mm (inclusive) to 600 mm (inclusive) and is set larger than the diameter of the wafer 50. A power supply (not shown) is connected to the second aperture 45. A desired voltage can be applied from the power supply to the second aperture 45. The second aperture 45 can disperse the ion beams from the first aperture 44 and irradiate the wafer with them through the slit 45-1.

Using the slit 45-1 having the width W2 larger than the width W1 of the slit 44-1 of the first aperture 44, the second aperture 45 can change the ion beams in the linear direction to ion beams in random directions (for example, a direction oblique with respect to the first and second directions) and irradiate the wafer with them. At this time, the ion beam energy (kinetic energy) in the first direction can be reduced to 100 eV or less (for example, about 50 eV) by irradiating the wafer with the ion beams in random directions. The porous semiconductor film can be formed on the wafer 50 by irradiating it with the ion beams having the relatively small energy.

Note that the graphite of the first aperture 44 and the second aperture 45 may be coated with an Si film or an SiC film. When forming a porous semiconductor film of Si or Sic, this can reduce mixing of carbon (C) into the porous semiconductor film.

The electrostatic chuck 46 has the wafer 50 attached on its surface and is arranged such that the ion beams from the second aperture 45 enter the wafer 50. The surface of the electrostatic chuck 46 to which the wafer 50 is attached is coated with an Si film or an SiC film. The diameter of the electrostatic chuck 46 is smaller than that of the wafer 50.

The electrostatic chuck 46 adjusts the temperature of the wafer 50. More specifically, the electrostatic chuck 46 can control the temperature of the wafer 50 within the range of, for example, −100° C. to 500° C. This makes it possible to control the density, composition, cavity size, cavity density, and the like of the porous semiconductor film formed on the surface of the wafer 50.

The electrostatic chuck 46 also adjusts the position of the wafer 50. More specifically, the electrostatic chuck 46 can control the position of the wafer 50 by mechanically adjusting the translation, rotation, and tilt of the wafer 50 with respect to the ion beams to irradiate the wafer. This makes it possible to uniform the porous semiconductor film formed on the surface of the wafer 50.

Furthermore, the electrostatic chuck 46 finely adjusts the ion beam energy. A DC pulse power supply 47 is connected to the electrostatic chuck 46. The DC pulse power supply 47 applies a DC pulse voltage having a desired duty ratio (duty cycle) to the electrostatic chuck 46. This makes it possible to control the energy of the ions (or neutrons) that irradiate (collide against) the wafer 50.

The Faraday cup array 49 is arranged on the opposite side of the ion source with respect to the electrostatic chuck 46 (wafer 50). The Faraday cup array 49 includes a plurality of Faraday cups 48 arranged in an array. When the position of the wafer 50 is mechanically adjusted, the Faraday cups 48 can measure the ion density distribution of the ion beams and monitor the uniformity and the like of the ion beams.

As described above, the manufacturing apparatus makes the relatively small energy of 100 eV or less enter the wafer 50, thereby forming the porous semiconductor film on the wafer 50.

Normally, when generating the ion beams having the energy of 100 eV or less to form the porous semiconductor film on the wafer 50, the ion current, that is, the number of ion atoms (ion density) needs to be decreased. Hence, formation of the porous semiconductor film takes a long time.

In the manufacturing apparatus, however, the ion beams to irradiate the water in the first direction through the first aperture 44 are dispersed in random directions by the second aperture 45. The ion beam energy (incident energy) in the collision direction (first direction) to the wafer 50 is thus reduced. That is it is possible to reduce the ion beam energy that enters the water 50 without decreasing the number of ion atoms. Hence, the porous semiconductor film can be formed in a short time.

[Manufacturing Method of Third Film 25-3 (Porous Semiconductor Film)]

A manufacturing method of a third film 25-3 according to the second embodiment will be described below with reference to FIG. 16.

Figure 16:
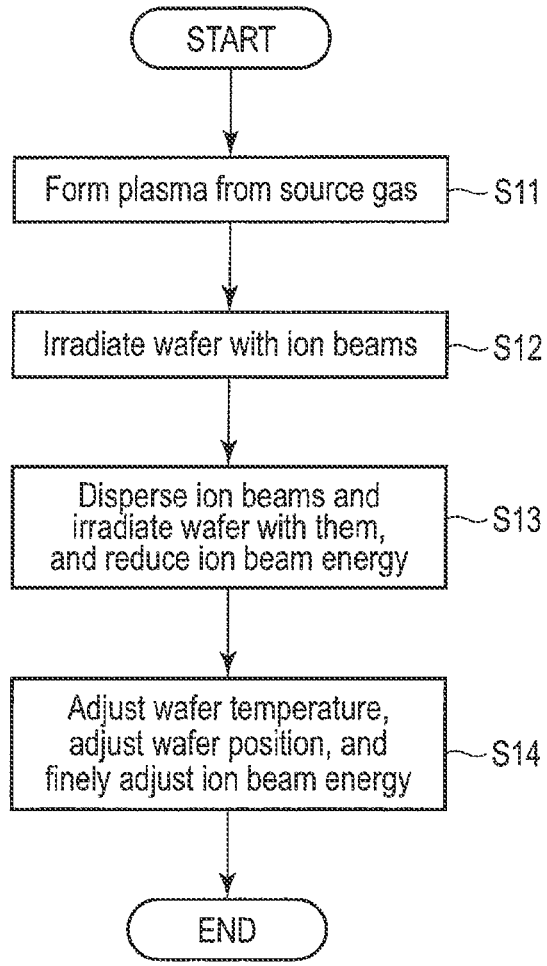
FIG. 16 is a flowchart showing an example of a manufacturing method of the third film according to the second embodiment.

FIG. 16 is a flowchart showing an example of the manufacturing method of the third film 25-3 according to the second embodiment.

As shown in FIG. 16, first, in step S11, the high-frequency power supply 41 supplies an electromagnetic wave to generate a plasma from the source gas in the ion source chamber 43. An ion plasma is thus generated in the ion source chamber 43.

In step S12, the first aperture 44 extracts the ion plasma in the ion source chamber 43 as ion beams and irradiates a wafer with them through the slit 44-1. At this time, the ion beams irradiating the wafer through the first aperture 44 are ion beams in the linear direction.

In step S13, the second aperture 45 disperses the ion beams to irradiate the wafer through the first aperture 44 and irradiates the wafer with them through the slit 45-1. At this time, the ion beams to irradiate the wafer through the second aperture 45 are ion beams in random directions. The ion beam energy in the first direction can thus be reduced to 100 eV or less (for example, about 50 eV).

In step S14, the electrostatic chuck 46 adjusts the temperature and position of a wafer 50 the ion beams to irradiate it through the second aperture 45 enter. In addition, the DC pulse power supply 47 connected to the electrostatic chuck 46 applies a DC pulse voltage, thereby finely adjusting the energy of the ion beams that enter the wafer 50.

A porous semiconductor film is thus formed on the wafer 50.

[Effects]

Figure 17:
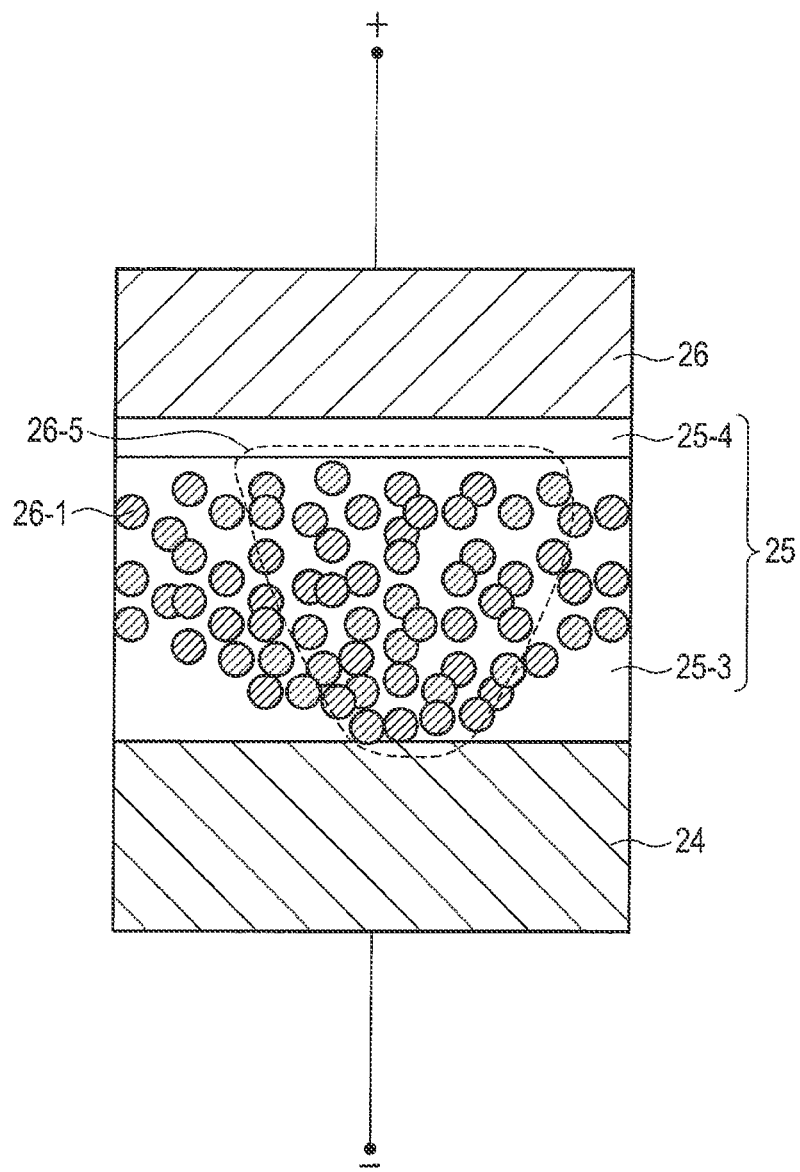
FIG. 17 is a sectional view showing an example of the set operation (low resistance state) of a memory cell according to Comparative Example 2.

FIG. 17 is a sectional view showing an example of the set operation (low resistance state) of a memory cell according to Comparative Example 2.

As shown in FIG. 17, in Comparative Example 2, the variable resistance element 25 is formed from a stacked film of the third film 25-3 including a porous semiconductor film or a nonporous a-Si film and the fourth film 25-4 containing O, F, or N.

When a bias is applied to the variable resistance element 25 in the set operation according to Comparative Example 2, the metal ions 26-1 diffuse in the entire third film 25-3 or the a-Si film. For this reason, as in Comparative Example 1, the resistance value in the low resistance state and the high resistance state varies between the memory cells MC, as shown in FIG. 12.

To the contrary, according to the second embodiment, the variable resistance element 25 is formed from a stacked film of the first film 25-1 including an insulating metal oxide film or an insulating semiconductor oxide film, the third film 25-3 including a porous semiconductor film, and the fourth film 25-4 containing O, N, or F. The metal, ions 26-1 widely diffuse in the third film 25-3. On the other hand, the first film 25-1 has an oxygen deficiency region, and the metal ions 26-1 narrowly diffuse in a region where the oxygen deficiency density is high.

As shown in FIG. 14, when a bias is applied to the variable resistance element 25 in the set operation according to the second embodiment, the metal ions 26-1 can diffuse in the entire third film 25-3, and after that, the filament 26-2 can be formed in a narrow region of the first film 25-1. As in the first embodiment, it is therefore possible to reduce the variation in the resistance value in the low resistance state and the high resistance state between the memory cells MC as compared to Comparative Example 2, as shown in FIG. 6.

Additionally, in the second embodiment, the metal ions 26-1 diffuse in the cavity portion of the third film 25-3 including a porous semiconductor film. The metal ions 26-1 temporarily accumulated in the cavity portion hardly move. This improves the retention characteristic in the high resistance state. More specifically, when a porous semiconductor film is used as the third film 25-3, a retention characteristic 1,000 times or more can be obtained as compared to a case in which an a-Si film is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a second electrode containing a metal element; and
a variable resistance element formed between the first electrode and the second electrode,
wherein the variable resistance element comprises:
an insulating first film disposed on a side of the first electrode and containing oxygen and having an oxygen deficiency; and
a second film which is disposed on a side of the second electrode and which contains an element having an electronegativity higher than an electronegativity of the metal element of the second electrode, a diffusion coefficient of the metal element of the second electrode in the second film being larger than a diffusion coefficient of the metal element of the second electrode in the insulating first film.

2. The device of claim 1, wherein the second film includes one of a sulfide film and a selenium compound film.

3. A semiconductor device comprising:
a first electrode;
a second electrode containing a metal element; and
a variable resistance element formed between the first electrode and the second electrode,
wherein the variable resistance element comprises:
an insulating first film disposed on a side of the first electrode and containing oxygen; and
a second film which is disposed on a side of the second electrode and which contains an element having an electronegativity higher than an electronegativity of the metal element of the second electrode, a diffusion coefficient of the metal element of the second electrode in the second film being larger than a diffusion coefficient of the metal element in the insulating first film, and
the second film comprises:
a third film formed on the side of the first electrode and including porous semiconductor film; and
a fourth film formed on the side of the second electrode and containing one of oxygen, fluorine, and nitrogen.

4. The device of claim 3, wherein the third film includes one of Si, SiGe, SiC, and carbon.

5. The device of claim 3, wherein the third film includes a cavity having a diameter of 1 nm (inclusive) to 3 nm (inclusive).

6. The device of claim 3, wherein the fourth film includes one of SiOx, SiFx, SiNx, and Si doped with one of oxygen, fluorine, and nitrogen.

7. The device of claim 1, wherein the first film includes one of an insulating metal oxide film, an insulating semiconductor oxide film, and an insulating silicate film.

8. The device of claim 1, wherein the first electrode includes a conductive film containing oxygen.

9. The device of claim 1, wherein the metal element includes one of Cu, Ag, Au, and Ru.

10. The device of claim 1, wherein the second film includes one of $Cu_2S$, $Ag_2S$, $GeS_X$, $SiS_X$, $CS_X$, $Cu_2Se$, $Ag_2Se$, $GeSe_X$, $SiSe_X$, and $CSe_X$.

11. The device of claim 1, wherein the first film includes one of $V_2O_5$, $Nb_2O_5$, $Ta_2O_5$, $TiO_2$, $ZrO_2$, $HfO_2La_2O_3$, $Al_2O_3$, $LaAlO_X$, $MgO$, $SiO_X$, $GeO_X$, and $SiGeO_X$.

12. The device of claim 1, wherein the first electrode includes one of TaN, TiC, TaC, Pt, and Pd, which are doped with O, $RuO_X$, $PtO_X$, $InO_X$, $InSnO_X$, $SnO_X$, $IrO_X$, and $RhO_X$.

13. The device of claim 1, wherein a bonding energy between the first film and oxygen is not less than the bonding energy between Si and oxygen.

14. The device of claim 1, wherein a film thickness of the first film is not more than 3 nm.

15. The device of claim 1, wherein the second film is doped with the metal element.

* * * * *